United States Patent
Kwon et al.

(10) Patent No.: US 10,971,563 B2
(45) Date of Patent: Apr. 6, 2021

(54) ORGANIC LIGHT-EMITTING DISPLAY APPARATUS

(71) Applicant: Samsung Display Co., Ltd., Yongin-si (KR)

(72) Inventors: Oh-June Kwon, Yongin-si (KR);
Kwan-Hee Lee, Yongin-si (KR);
Seung-Yong Song, Yongin-si (KR);
Young-Seo Choi, Yongin-si (KR);
Jin-Hwan Jeon, Yongin-si (KR);
Sun-Young Jung, Yongin-si (KR);
Ji-Hun Ryu, Yongin-si (KR);
Young-Cheol Joo, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 169 days.

(21) Appl. No.: 16/277,867

(22) Filed: Feb. 15, 2019

(65) Prior Publication Data

US 2019/0181193 A1 Jun. 13, 2019

Related U.S. Application Data

(62) Division of application No. 15/893,526, filed on Feb. 9, 2018, which is a division of application No. (Continued)

(30) Foreign Application Priority Data

May 31, 2010 (KR) .................. 10-2010-0051442

(51) Int. Cl.
*H01L 27/32* (2006.01)
*H01L 51/52* (2006.01)
(Continued)

(52) U.S. Cl.
CPC ............ *H01L 27/3232* (2013.01); *C09K 9/02* (2013.01); *H01L 51/5253* (2013.01);
(Continued)

(58) Field of Classification Search
None
See application file for complete search history.

(56) References Cited

U.S. PATENT DOCUMENTS 6,067,138 A  5/2000  Nishiguchi et al.
6,356,324 B1  3/2002  Nishiguchi et al.
(Continued)

FOREIGN PATENT DOCUMENTS

JP  2008-122485  5/2008
KR  10-2001-0111052 A  12/2001
(Continued)

OTHER PUBLICATIONS

Korean Office Action dated Jun. 8, 2016 of the corresponding Korean Patent Application No. 10-2010-0051442, (7 pages).
(Continued)

*Primary Examiner* — Ashok Patel
(74) *Attorney, Agent, or Firm* — Lewis Roca Rothgerber Christie LLP

(57) ABSTRACT

An organic light-emitting display apparatus for selectively realizing circular polarization according to external light conditions, including a substrate; an organic light-emitting device on the substrate; a sealing member on the organic light-emitting device; a phase retardation layer on a surface of the substrate, the organic light-emitting device, or the sealing member; and a linear polarization layer on another surface of the substrate, the organic light-emitting device, or the sealing member, wherein the linear polarization layer is located to be closer to a source of external light than the (Continued)

phase retardation layer, and wherein the linear polarization layer comprises a photochromic material.

4 Claims, 10 Drawing Sheets

Related U.S. Application Data

15/075,040, filed on Mar. 18, 2016, now Pat. No. 9,929,219, which is a division of application No. 14/262,549, filed on Apr. 25, 2014, now Pat. No. 9,324,970, which is a division of application No. 13/964,002, filed on Aug. 9, 2013, now Pat. No. 8,729,793, which is a division of application No. 13/040,157, filed on Mar. 3, 2011, now Pat. No. 8,508,121.

(51) Int. Cl.
    *C09K 9/02*      (2006.01)
    *H05B 33/22*     (2006.01)
(52) U.S. Cl.
    CPC ...... *H01L 51/5271* (2013.01); *H01L 51/5293* (2013.01); *H05B 33/22* (2013.01)

(56) References Cited

U.S. PATENT DOCUMENTS

| | | |
|---|---|---|
| 6,671,008 B1 | 12/2003 | Li et al. |
| 9,555,589 B1 | 1/2017 | Ambur et al. |
| 2005/0231085 A1 | 10/2005 | Song et al. |
| 2006/0113907 A1 | 6/2006 | Im et al. |
| 2008/0048558 A1 | 2/2008 | Song et al. |
| 2008/0112049 A1 | 5/2008 | Umemoto et al. |
| 2008/0218067 A1 | 9/2008 | Lee et al. |
| 2009/0296188 A1 | 12/2009 | Jain et al. |
| 2010/0142050 A1 | 6/2010 | Suzuki et al. |
| 2011/0108808 A1* | 5/2011 | Kim ............... H01L 51/5281 257/40 |
| 2013/0181602 A1 | 7/2013 | Kang et al. |
| 2013/0222882 A1 | 8/2013 | Seki et al. |

FOREIGN PATENT DOCUMENTS

| | | |
|---|---|---|
| KR | 10-2002-0053827 A | 7/2002 |
| KR | 10-2003-0028549 A | 4/2003 |
| KR | 10-2007-0100378 A | 10/2007 |
| KR | 10-2008-0006922 | 1/2008 |
| KR | 10-0852115 | 8/2008 |
| KR | 10-2009-0046398 A | 5/2009 |
| KR | 10-2009-0050367 | 5/2009 |

OTHER PUBLICATIONS

KIPO Registration Determination Certificate dated Aug. 12, 2016, for corresponding Korean Patent Application No. 10-2010-0051442 (6 pages).

* cited by examiner

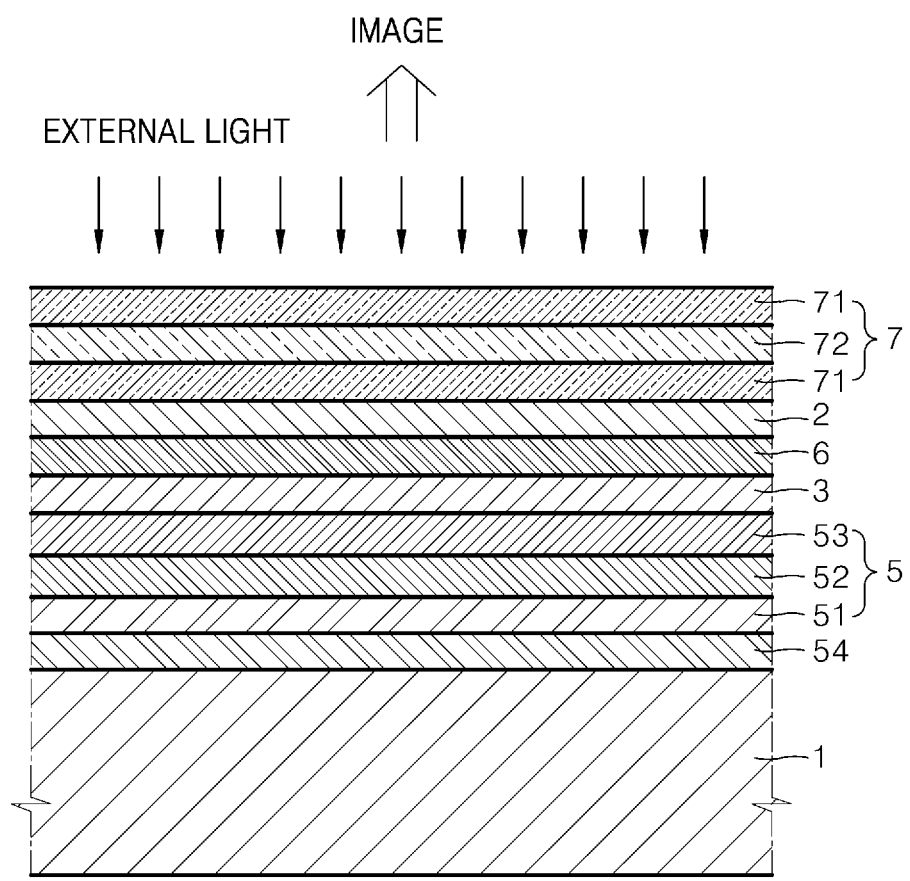

ORGANIC LIGHT-EMITTING DISPLAY APPARATUS

CROSS-REFERENCE TO RELATED PATENT APPLICATION

This application is a divisional of U.S. patent application Ser. No. 15/893,526, filed Feb. 9, 2018, which in turn is a divisional of U.S. patent application Ser. No. 15/075,040, filed Mar. 18, 2016, now U.S. Pat. No. 9,929,219, issued Mar. 27, 2018, which in turn is a divisional of U.S. patent application Ser. No. 14/262,549, filed Apr. 25, 2014, now U.S. Pat. No. 9,324,970, issued Apr. 26, 2016, which in turn is a divisional of U.S. patent application Ser. No. 13/964,002, filed Aug. 9, 2013, now U.S. Pat. No. 8,729,793, issued May 20, 2014, which in turn is a divisional of U.S. patent application Ser. No. 13/040,157, filed Mar. 3, 2011, now U.S. Pat. No. 8,508,121, issued Aug. 13, 2013, which claims priority to and the benefit of Korean Patent Application No. 10-2010-0051442, filed May 31, 2010, the entire contents of all of which are incorporated herein by reference.

BACKGROUND

1. Field

The following description relates to organic light-emitting display apparatuses, and more particularly, to organic light-emitting display apparatuses for selectively realizing circular polarization according to external light conditions.

2. Description of Related Art

An organic light-emitting display apparatus uses a circular polarization film for improving the contrast thereof under an external light environment such as sunlight.

A liquid crystal display (LCD) apparatus uses a polarization film, but an organic light-emitting display apparatus uses a circular polarization film as a main component for realizing an image. When the circular polarization film is used in order to prevent or reduce external light from being reflected, the brightness of the organic light-emitting display apparatus is reduced by at least 50%.

In particular, in situations where the reflection of external light has limited effect on the visibility of an organic light emitting display apparatus, such as indoors or at night, a reduction in brightness is serious while visibility is only slightly improved by a circular polarization film.

SUMMARY

An aspect of an embodiment of the present invention is directed toward organic light-emitting display apparatuses for selectively realizing circular polarization according to external light conditions.

An embodiment of the present invention provides an organic light-emitting display apparatus including a substrate; an organic light-emitting device on the substrate; a sealing member on the organic light-emitting device; a phase retardation layer on a surface of the substrate, the organic light-emitting device, or the sealing member; and a linear polarization layer formed on another surface of the substrate, the organic light-emitting device, or the sealing member. Here, the linear polarization layer is located to be closer to a source of external light than the phase retardation layer, and the linear polarization layer includes a photochromic material.

The linear polarization layer may be on the substrate, the phase retardation layer may be on the linear polarization layer, and the organic light-emitting device may be on the phase retardation layer.

The phase retardation layer may be on the substrate, the organic light-emitting device may be on the phase retardation layer, and the linear polarization layer may be on the surface of the substrate opposite to the surface of the substrate on which the phase retardation layer is located.

The phase retardation layer and the linear polarization layer may be sequentially arranged in the stated order on the surface opposite to the surface of the substrate on which the organic light-emitting device is located.

The phase retardation layer may be on the organic light-emitting device, and the linear polarization layer may be on the phase retardation layer.

The organic light-emitting display apparatus may further include a protective layer on the organic light-emitting device, the phase retardation layer may be on the protective layer, and the linear polarization layer may be on the phase retardation layer.

The organic light-emitting display apparatus may further include a protective layer on the organic light-emitting device, the phase retardation layer may be between the organic light-emitting device and the protective layer, and the linear polarization layer may be on the protective layer.

The organic light-emitting display apparatus may further include a reflective layer interposed between the substrate and the organic light-emitting device, the phase retardation layer may be between the reflective layer and the organic light-emitting device, and the linear polarization layer may be on the organic light-emitting device.

The sealing member may be a transparent substrate, and the phase retardation layer and the linear polarization layer may be sequentially arranged in the stated order on the surface of the sealing member opposite to the surface of the sealing member, which faces the organic light-emitting device.

The sealing member may be a transparent substrate, the phase retardation layer may be on the surface of the sealing member, which faces the organic light-emitting device, and the linear polarization layer may be on the surface of the sealing member opposite to the surface of the sealing member, on which the phase retardation layer is located.

The sealing member may be a transparent substrate, the linear polarization layer may be on the surface of the sealing member, which faces the organic light-emitting device, and the phase retardation layer may be on a surface of the linear polarization layer, which faces the organic light-emitting device.

The phase retardation layer may include a quarter-wave plate or a half-wave plate.

The linear polarization layer may include a plurality of wire grids that are spaced apart from each other.

According to an aspect of an embodiment of the present invention, since the wire grids constituting the linear polarization plate are selectively discolored or become transparent, according to external light conditions, the contrast of the organic light-emitting display apparatus is increased under sunlight, and a reduction in the brightness of the organic light-emitting display apparatus is prevented or reduced in the outdoors or at night.

In addition, according to an aspect of an embodiment of the present invention, since each layer may be formed without an adhesive layer, the thickness of the organic light-emitting display apparatus may be reduced.

BRIEF DESCRIPTION OF THE DRAWINGS

The accompanying drawings, together with the specification, illustrate exemplary embodiments of the present invention, and, together with the description, serve to explain the principles of the present invention.

FIG. 15 is a cross-sectional views of a top-emission type organic light-emitting display apparatuses according to an embodiment of the present invention.

DETAILED DESCRIPTION OF THE INVENTION

Figure 1:
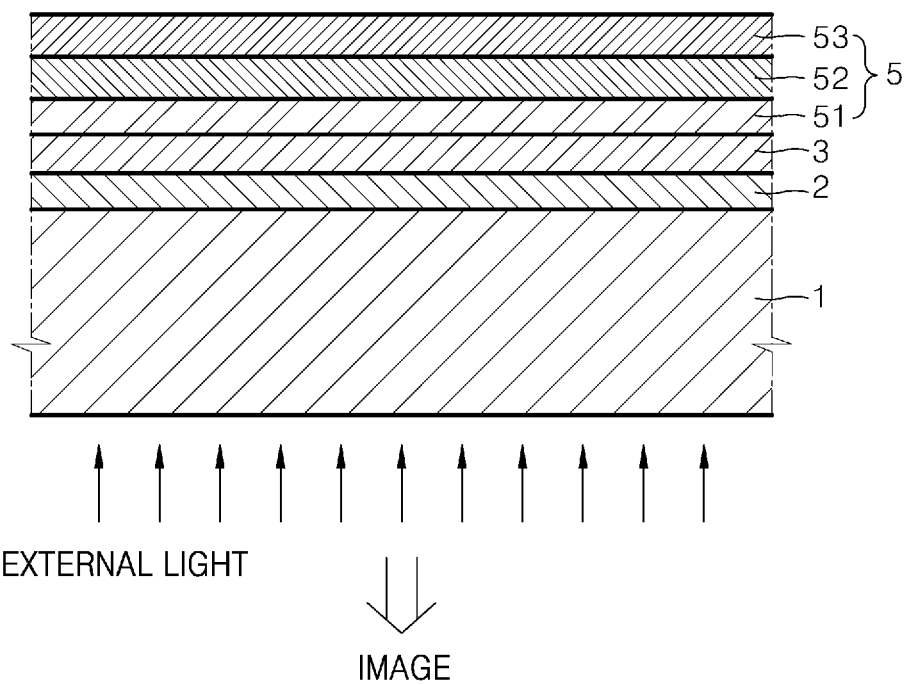
FIG. 1 is a cross-sectional view of an organic light-emitting display apparatus according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. Like reference numerals designate like elements throughout the specification.

FIG. 1 is a cross-sectional view of an organic light-emitting display apparatus according to an embodiment of the present invention.

Referring to FIG. 1, the organic light-emitting display apparatus according to the present embodiment includes a substrate 1 formed of a transparent material, and a linear polarization layer 2, a phase retardation layer 3, and an organic light-emitting device 5 which are sequentially arranged in the stated order on the substrate 1. Although not illustrated, a sealing member for sealing the organic light-emitting device 5 from the outside, such as a glass, a thin film member, or a metal cap, may be on the organic light-emitting device 5.

The substrate 1 may be a substrate formed of a transparent glass material containing $SiO_2$ as a main component. A buffer layer may also be on the substrate 1 to smoothen the substrate 1 and to prevent or reduce the penetration of impurities, and may be formed of $SiO_2$ and/or SiNx. The substrate 1 is not limited thereto. Alternatively, the substrate 1 may be formed of a transparent plastic material.

The linear polarization layer 2 is on the substrate 1, and the phase retardation layer 3 is on the linear polarization layer 2. The organic light-emitting device 5 is on the phase retardation layer 3. The linear polarization layer 2 and the phase retardation layer 3 are arranged so that the linear polarization layer 2 may be located to be closer to a source of external light than the phase retardation layer 3, and the phase retardation layer 3 may be on the linear polarization layer 2. Another light-transmission layer may be interposed between the linear polarization layer 2 and the phase retardation layer 3.

The organic light-emitting device 5 includes a first electrode layer 51 and a second electrode 53, which face each other, and includes an emissive layer 52 interposed between the first electrode layer 51 and the second electrode layer 53.

The first electrode layer 51 may be formed of a transparent conductive material, and may be formed of, for example, indium tin oxide (ITO), indium zinc oxide (IZO), $In_2O_3$, and ZnO. In addition, the first electrode layer 51 may be formed with a preselected or predetermined pattern by using a photolithography method. When the organic light-emitting display apparatus is a passive matrix (PM) type, the first electrode layer 51 may be formed in a stripe pattern with a preselected or predetermined interval. When the organic light-emitting display apparatus is an active matrix (AM) type, the first electrode layer 51 may be formed to correspond to a pixel. In the case of the AM type organic light-emitting display apparatus, a pixel circuit layer including at least one TFT may be on the substrate 1 below the first electrode layer 51. The first electrode layer 51 is electrically connected to the pixel circuit layer. Such PM and AM type organic light-emitting display apparatuses according to embodiments of the present invention will be described in more detail below.

The first electrode layer 51, formed as a transparent electrode, may be connected to an external terminal, and may function as an anode.

The second electrode layer 53 may be on the first electrode layer 51, and may be a reflective electrode. In addition, the second electrode layer 53 may be formed of aluminum (Al), silver (Ag), and/or calcium (Ca), and may be connected to a second external terminal so as to function as a cathode.

In the case of a PM type organic light-emitting display apparatus, the second electrode layer 53 may be formed to extend in a stripe pattern along a direction that is perpendicular to the extension direction of the stripe pattern of the first electrode layer 51. In the case of an AM type organic light-emitting display apparatus, the second electrode layer 53 may be formed to correspond to a pixel. In this case, the second electrode layer 53 may be on an entire portion of an active region on which an image is realized, which will be described in more detail.

The first electrode layer 51 and the second electrode layer 53 may have opposite polarities.

The emissive layer 52 interposed between the first electrode layer 51 and the second electrode layer 53 emits light by electrically driving the first electrode layer 51 and the second electrode layer 53. The emissive layer 52 may be formed of a low molecular weight organic material or a high molecular weight organic material.

When the emissive layer 52 is a low molecular weight organic film formed of a low molecular weight organic material, a hole transport layer (HTL) and a hole injection layer (HIL) are stacked in a direction towards the first electrode layer 51, and an electron transport layer (ETL) and an electron injection layer (EIL) are stacked in a direction towards the second electrode layer 53, with respect to an organic emission layer (EML). If necessary, various other layers may be formed in addition to the HIL, the HTL, the ETL, and the EIL.

Examples of organic materials that may be used to form the emissive layer 52 include any of various suitable materials such as copper phthalocyanine (CuPc), N,N'-di(naphthalene-1-yl)-N,N'-diphenyl-benzidine (NPB), and tris-8-hydroxyquinoline aluminum (Alq3).

When the emissive layer 52 is a high molecular weight organic film formed of a high molecular weight organic material, only a HTL may be disposed in a direction towards the first electrode layer 51 with respect to an organic EML. In this case, the HTL may be formed of poly-(2,4)-ethylene-dihydroxy thiophene (PEDOT), polyaniline (PANI), or the like, and may be formed on the first electrode layer 51 by using an inkjet printing method or a spin coating method. In addition, the organic EML may be formed of polyphenylenevinylene (PPV), Soluble PPV's, Cyano-PPV, polyfluorene, or the like, and may be formed to have a color pattern by using a common method, such as an inkjet printing method, a spin coating method, and/or a heat transfer method that uses a laser.

According to an embodiment of the present invention, as shown in FIG. 1, light emitted from the emissive layer 52 of the organic light-emitting device 5 is emitted towards the substrate 1, and a user views an image below the substrate 1, that is, below a lower portion of the substrate 1. In such a bottom-emission type organic light-emitting display apparatus, external light, such as sunlight, may be introduced through the substrate 1, thereby reducing the contrast of the organic light-emitting display apparatus.

However, according to the present embodiment, the linear polarization layer 2 and the phase retardation layer 3 may constitute a circular polarization layer, thereby preventing or reducing external light from being reflected. In one embodiment, the phase retardation layer 3 may be a quarter-wave plate.

Of external light from outside of the lower portion of the substrate 1, a component in an absorption-axis direction of the linear polarization layer 2 is absorbed, and a component in a transmission-axis direction of the linear polarization layer 2 is transmitted. The component in the transmission-axis direction is converted into circularly polarized light that rotates in one direction while transmitting through the phase retardation layer 3, and then is reflected by the second electrode layer 53. When reflected, the circularly polarized light that rotates in the one direction is converted into circularly polarized light that rotates in an opposite direction, and the circularly polarized light that rotates in the opposite direction is converted into linearly polarized light that is polarized in a direction perpendicular to an original transmission axis while transmitting through the phase retardation layer 3. Thus, since the linearly polarized light is absorbed by an absorption axis of the linear polarization layer 2, the linearly polarized light is not emitted out of the lower portion of the substrate 1, thereby preventing or reducing external light from being reflected and further improving the contrast of the organic light-emitting display apparatus.

Since the linear polarization layer 2 and the phase retardation layer 3 are on the substrate 1, an adhesive layer is not located between the linear polarization layer 2 and the phase retardation layer 3, and thus the thickness of the organic light-emitting display apparatus may be reduced. In addition, since an image emitted from the emissive layer 52 is not transmitted through an adhesive layer, the brightness of the organic light-emitting display apparatus may be increased.

Figure 2:
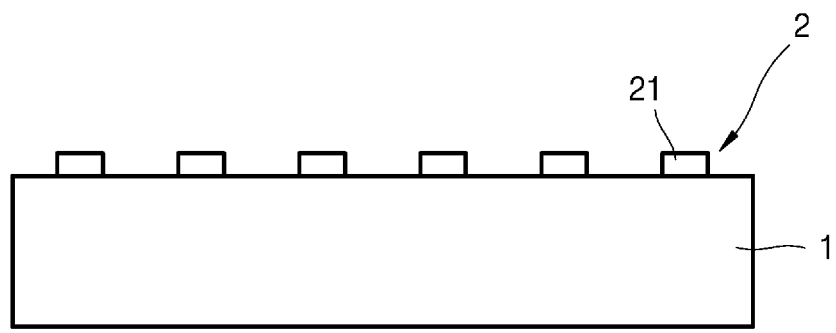
FIG. 2 is a cross-sectional view of a more detailed example of a linear polarization layer according to FIG. 1.

FIG. 2 is a cross-sectional view of a more detailed example of the linear polarization layer 2.

The linear polarization layer 2 includes a plurality of wire grids 21 that are on the substrate 1 with a preselected or predetermined interval therebetween. The wire grids 21 may each have a width of several tens of nanometers (nm), and may be spaced by an interval of several tens to several hundreds of nanometers (nm).

According to the present embodiment, the wire grids 21 may be formed of a photochromic material.

The photochromic material may be a naphthopyran-based compound, a spirooxazine-based compound, or a spiropyran-based compound, but is not limited thereto.

Examples of the spiropyran-based compound may include 1',3',3'-trimethylspiro(2H-1-benzopyran-2,2'-indoline), 1',3',3'-trimethylspiro-8-nitro(2H-1-benzopyran-2,2'-indoline), 1',3',3'-trimethyl-6-hydroxyspiro(2H-1-benzopyran-2,2'-indoline), 1',3',3'-trimethylspiro-8-methoxy(2H-1-benzopyran-2,2'-indoline), 5'-chloro-1',3',3'-trimethyl-6-nitrospiro(2H-1-benzopyran-2,2'-indoline), 6,8-dibromo-1',3',3'-trimethylspiro(2H-1-benzopyran-2,2'-indoline), 6,8-dibromo-1',3',3'-trimethylspiro(2H-1-benzopyran-2,2'-indoline), 8-ethoxy-1',3',3',4',7'-pentamethylspiro(2H-1-benzopyran-2,2'-indoline), 5'-chloro-1',3',3'-trimethylspiro-6,8-dinitro(2H-1-benzopyran-2,2'-indoline), 3,3-diphenyl-3H-naphtho-(2,1-13)pyran, 1,3,3-triphenylspiro [indoline-2,3'-(3H)-naphtho(2,1-b)pyran], 1-(2,3,4,5,6-pentamethylbenzyl)-3,3-dimethylspiro[indoline-2,3'-(3H)-naphtho(2,1-b)pyran], 1-(2-methoxy-5-nitrobenzyl)-3,3-dimethylspiro [indoline-2,3'-naphtho(2,1-b)pyran], 1-(2-nitrobenzyl)-3,3-dimethylspiro [indoline-2,3'-naphtho(2,1-b)pyran], 1-(2-naphthylmethyl)-3,3-dimethylspiro [indoline-2,3'-naphtho(2,1-b)pyran], 1,3,3-trimethyl-6'-nitro-spiro [2H-1-benzopyran-2,2'-(2H)-indole], or the like.

Examples of the spirooxazine-based compound may include 1,3,3-trimethylspiro [indoline-2,3'-(3H)naphtho(2,1-b)(1,4)oxadine], 5-methoxy-1,3,3-trimethylspiro [indoline-2,3'-(3H)naphtho(2,1-b)(1,4)oxadine], 5-chloro-1,3,3-trimethylspiro [indoline-2,3'-(3H)naphtho(2,1-b)(1,4)oxadine], 4,7-ethoxy-1,3,3-trimethylspiro [indoline-2,3'-(3H)naphtho(2,1-b)(1,4)oxadine], 5-chloro-1-butyl-3,3-dimethylspiro [indoline-2,3'-(3H)naphtho(2,1-b)(1,4)oxadine], 1,3,3,5-tetramethyl-9'-ethoxyspiro [indoline-2,3'-(3H)naphtho(2,1-b)(1,4)oxadine], 1-benzyl-3,3-dimethylspiro [indoline-2,3'-(3H)naphtho(2,1-b)(1,4)oxadine], 1-(4-methoxybenzyl)-3,3-dimethylspiro [indoline-2,3'-(3H)naphtho(2,1-b)(1,4)oxadine], 1-(2-methylbenzyl)-3,3-dimethylspiro [indoline-2,3'-(3H)naphtho(2,1-b)(1,4)oxadine], 1-(3,5-dimethylbenzyl)-3,3-dimethylspiro [indoline-2,3'-(3H)naphtho(2,1-b)(1,4)oxadine], 1-(4-chlorobenzyl)-3,3-dimethylspiro [indoline-2,3'-(3H)naphtho(2,1-b)(1,4)oxadine], 1-(4-bromobenzyl)-3,3-dimethylspiro [indoline-2,3'-(3H)naphtho(2,1-b)(1,4)oxadine], 1-(2-fluorobenzyl)-3,3-dimethylspiro [indoline-2,3'-(3H)naphtho(2,1-b)(1,4)oxadine], 1,3,5,6-tetramethyl-3-ethylspiro [indoline-2,3'-(3H)pyride(3,2-f)(1,4)benzooxadine], 1,3,3,5,6-pentamethylspiro [indoline-2,3'-(3H)pyride(3,2-f)(1,4)-benzooxadine], 6'-(2,3-dihydro-1H-indole-1-yl)-1,3-dihydro-3,3-dimethyl-1-propyl-spiro [2H-indole-2,3'-(3H)naphtho(2,1-b)(1,4)oxadine], 6'-(2,3-dihydro-1H-indole-1-yl)-1,3-dihydro-3,3-dimethyl-1-(2-methylpropyl)-spiro [2H-indole-2,3'-(3H)naphtho(2,1-b)(1,4)oxadine], 1,3,3-trimethyl-1-6'-(2,3-dihydro-1H-indole-1-yl)spiro [2H-indole-2,3'-(3H)naphtho(2,1-b)(1,4)oxadine], 1,3,3-trimethyl-6'-(1-piperidyl)spiro [2H-indole-2,3'-(3H) naphtho(2,1-b)(1,4)oxadine], 1,3,3-trimethyl-6'-(1-piperidyl)-6-(trifluoromethyl)spiro [2H-indole-2,3'-(3H)naphtho(2,1-b)(1,4)oxadine], 1,3,3,5,6-pentamethyl-spiro [2H-indole-2,3'-(3H)naphtho(2,1-b)(1,4)oxadine], or the like.

Examples of the naphthopyran-based compound may include 3,3-diphenyl-3H-naphtho(2,1-b)pyran, 2,2-diphenyl-2H-naphtho(1,2-b)pyran, 3-(2-fluorophenyl)-3-(4-methoxyphenyl)-3H-naphtho(2,1-b)pyran, 3-(2-methyl-4-methoxyphenyl)-3-(4-ethoxyphenyl)-3H-naphtho(2,1-b) pyran, 3-(2-furyl)-3-(2-fluorophenyl)-3H-naphtho(2,1-b) pyran, 3-(2-thienyl)-3-(2-fluoro-4-methoxyphenyl)-3H-naphtho(2,1-b)pyran, 3-[2-(1-methylpyrrolyl)]-3-(2-methyl-4-methoxyphenyl)-3H-naphtho(2,1-b)pyran, spiro [bicyclo (3.3.1)nonane-9,3'-3H-naphtho(2,1-b)pyran], spiro[bicyclo (3.3.1)nonane-9-2'-3H-naphtho(2,1-b)pyran], 4-[4-[6-(4-morphonyl)-3-phenyl-3H-naphtho(2,1-b)pyran-3-yl] phenyl]-morpholine, 4-[3-(4-methoxyphenyl)-3-phenyl-3H-naphtho(2,1-b)pyran-6-yl]-morpholine, 4-[3,3-bis(4-methoxyphenyl)-3H-naphtho(2,1-b)pyran-6-yl]-morpholine,4-[3-phenyl-3-[4-(1-piperidyl)phenyl]-3H-naphtho(2,1-b)pyran-6-yl]-morpholine, 2,2-diphenyl-2H-naphtho(2,1-b)pyran, or the like.

In one embodiment the photochromic material is maintained in a transparent state when the photochromic material is exposed to external light with a small amount of ultraviolet (UV) rays or weak brightness, such as light during the nighttime or indoor light. In addition, the photochromic material is discolored and changed to an opaque state when the photochromic material is exposed to external light with a great amount of UV rays or strong brightness, such as sunlight. In addition, the photochromic material is reversibly changed to the transparent state or the opaque state.

The wire grids 21 may be formed of a resin containing the photochromic material as a dye, and may be formed on the substrate 1 by patterning the resin.

As shown in the embodiment illustrated in FIG. 2, the wire grids 21 are formed as a single layer, but this is not required. The wire grids 21 may further include a transparent material layer formed on or below a layer containing a photochromic material.

In one embodiment the wire grids 21 are formed by appropriately selecting the photochromic material so that the wire grids 21 may be discolored under sunlight, and may be maintained in a transparent state under indoor light or dark conditions such as at night.

The phase retardation layer 3 illustrated in FIG. 1 is formed on the linear polarization layer 2 including the wire grids 21.

The phase retardation layer 3 may have double refraction characteristics.

Thus, according to the present embodiment, the phase retardation layer 3 may be formed of any material having double refraction characteristics, or any material formed by introducing double refraction characteristics to a material without double refraction characteristics.

Double refraction characteristics may be introduced to a material without double refraction characteristics by growing an alkali metal oxide having great polarisability in a direction parallel to an inclined direction of a crystal of the alkali metal oxide. In this case, the alkali metal oxide may be CaO and/or BaO.

That is, inclined crystal growth may be performed by depositing the alkali metal oxide on the substrate 1, on which the linear polarization layer 2 is formed, so as to be inclined in a direction perpendicular to the substrate 1 at a preselected or predetermined angle. The preselected or predetermined angle may be about 50 to about 80 degrees.

In this case and according to one embodiment, when the inclination crystal growth is performed at a preselected or predetermined angle of 50 degrees or less, growth is not appropriately performed in the inclined direction. In addition, in order to obtain a phase retardation effect and according to another embodiment, the preselected or predetermined angle is about 80 degrees or less. In one embodiment, if the preselected or predetermined angle exceeds 80 degrees, a phase retardation effect is reduced.

The phase retardation layer 3 formed of CaO and/or BaO by using the inclination crystal growth may be a half-wave plate or a quarter-wave plate according to the thickness of the phase retardation layer 3.

If the phase retardation layer 3 is formed of CaO, and in a thickness of about 2 to about 5 µm, the phase retardation layer 3 may be a quarter-wave plate. In addition, when the phase retardation layer 3 is formed in a thickness of about 4 to about 10 µm, the phase retardation layer 3 may be a half-wave plate. When the phase retardation layer 3 is a combination of a quarter-wave plate and a half-wave plate, modes for right circular polarization and left circular polarization may be freely set, and an angle for linear polarization may be set.

If the phase retardation layer 3 is formed of CaO and/or BaO, and the phase retardation layer 3 is used in an organic light-emitting display apparatus, the phase retardation layer 3 may also perform as a moisture absorption layer due to the moisture absorption characteristics thereof.

As such, when the alkali metal oxide is deposited so as to be inclined with respect to a surface of the linear polarization layer 2, the phase retardation layer 3 is configured so that a plurality of fine columns are formed on the linear polarization layer 2 so as to be inclined with respect to a surface of the linear polarization layer 2.

The linear polarization layer 2 and the phase retardation layer 3 may be formed by using various suitable methods. In addition, the linear polarization layer 2 and the phase retardation layer 3 may also be applied to any embodiments of the present invention.

Figure 3:
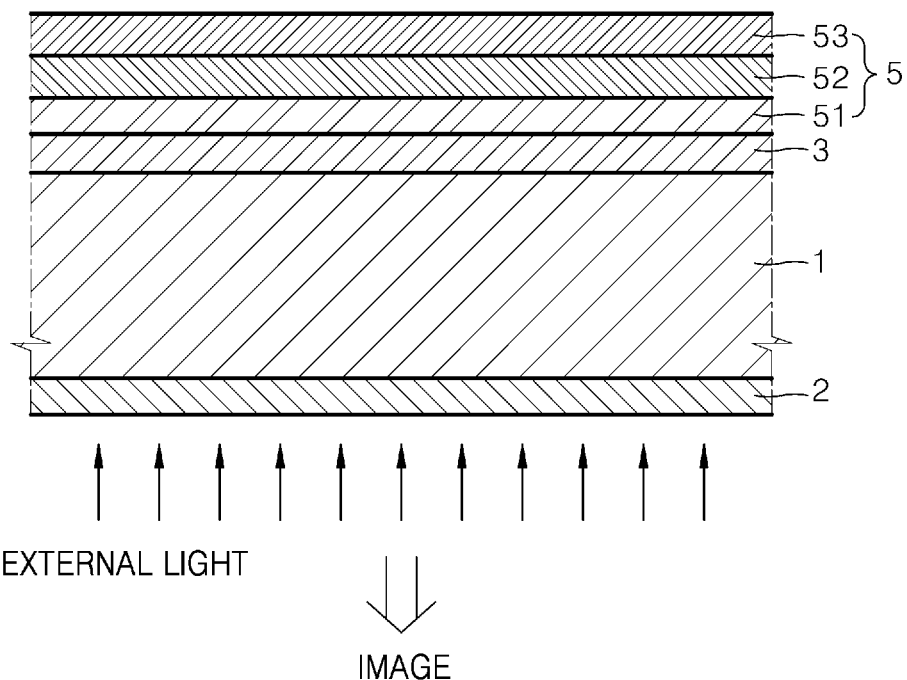
FIGS. 3 and 4 are cross-sectional views of bottom-emission type organic light-emitting display apparatuses according to embodiments of the present invention.

FIG. 3 is a cross-sectional view of a bottom-emission type organic light-emitting display apparatus according to another embodiment of the present invention. In FIG. 3, the linear polarization layer 2 is on a surface of the substrate 1, which faces outside the substrate 1, and the phase retardation layer 3 is on another surface of the substrate 1. The organic light-emitting device 5 is on the phase retardation layer 3. The descriptions of elements already described will not be repeated. Also in the bottom-emission type organic light-emitting display apparatus of FIG. 3, a photochromic material is discolored to exhibit linear polarization characteristics when the photochromic material is exposed to sunlight. In this case, external light from outside of the substrate 1 is converted into linearly polarized light that is polarized in a direction parallel to a transmission-axis direction while transmitting through the linear polarization layer 2, and is converted into circularly polarized light that rotates in one direction while transmitting through the substrate 1 and the phase retardation layer 3. Then, after the external light is reflected by the second electrode layer 53, the external light is converted into circularly polarized light that rotates in an opposite direction. The circularly polarized light that rotates in the opposite direction is converted into linearly polarized light that is polarized in a direction perpendicular to a transmission-axis direction while transmitting through the phase retardation layer 3. The linearly polarized light is not transmitted through the linear polarization layer 2, and thus reflected external light may not be viewed below the lower portion of the substrate 1.

In addition, since the linear polarization layer 2 becomes transparent indoors, the light absorption of the linear polarization layer 2 is reduced, and thus the combination of the linear polarization layer 2 and the phase retardation layer 3 does not form the circular polarization, thereby preventing or limiting a reduction in the brightness of the organic light-emitting display apparatus.

Figure 4:
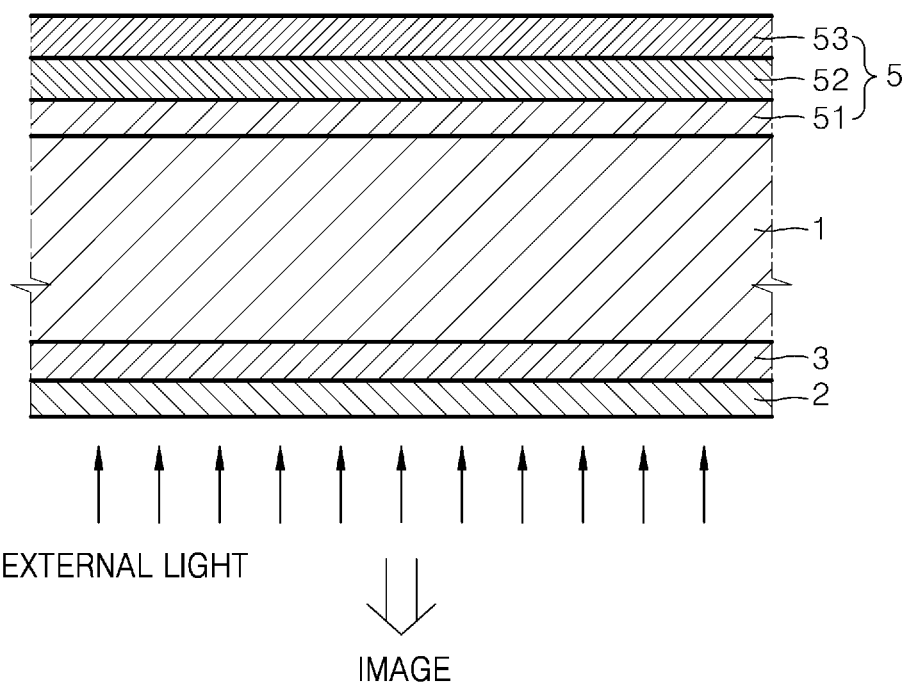

FIG. 4 is a cross-sectional view of a bottom-emission type organic light-emitting display apparatus according to another embodiment of the present invention. In FIG. 4, the phase retardation layer 3 and the linear polarization layer 2 are sequentially arranged in the stated order on a surface of the substrate 1, which faces outside the substrate 1, and the organic light-emitting device 5 is on another surface of the substrate 1. The descriptions of elements already described will not be repeated. Also in the bottom-emission type organic light-emitting display apparatus of FIG. 4, external light may be prevented or reduced from being reflected, thereby increasing the contrast of the bottom-emission type organic light-emitting display apparatus.

So far, examples of a bottom-emission type organic light-emitting display apparatus that realizes an image in a direction towards the substrate 1 have been described, but embodiments of the present invention are not limited thereto. Thus, the above-described descriptions may also be applied to a top-emission type organic light-emitting display apparatus that realizes an image emitted from the emissive layer 52 in an opposite direction to the substrate 1, i.e., not in a direction towards the substrate 1.

Figure 5:
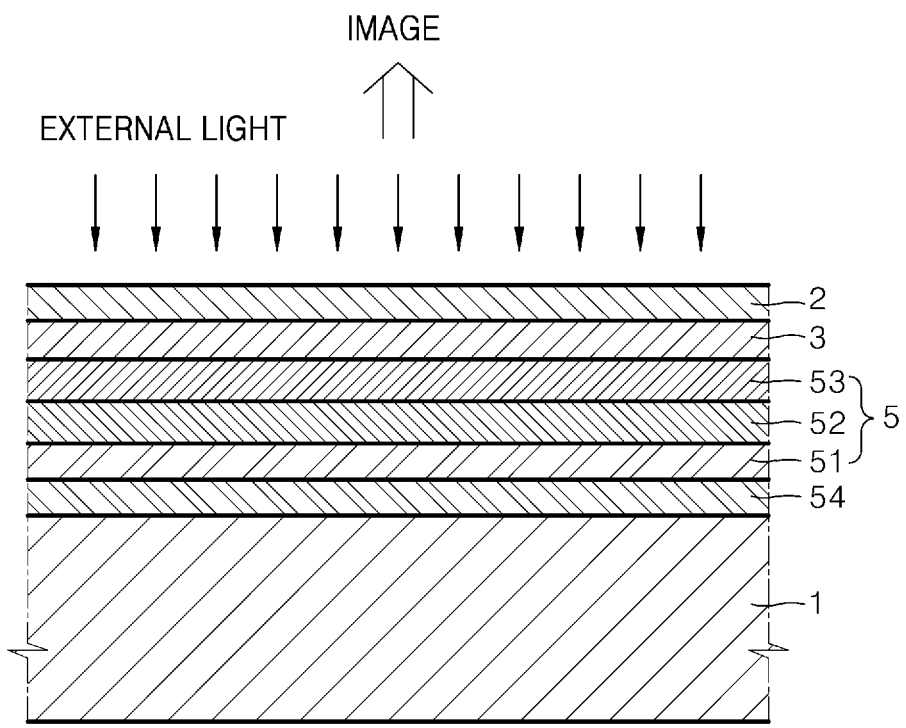
FIGS. 5-11 are cross-sectional views of top-emission type organic light-emitting display apparatuses according to embodiments of the present invention.

FIG. 5 is a cross-sectional view of a top-emission type organic light-emitting display apparatus according to another embodiment of the present invention. In FIG. 5, a reflective layer 54 is on the substrate 1, and the organic light-emitting device 5 is on the reflective layer 54. A sealing member for sealing the organic light-emitting device 5 from the outside may be on the organic light-emitting device 5.

Like in the above-described embodiments, the substrate 1 may be a transparent glass substrate, but the substrate 1 does not have to be transparent. In addition, the substrate 1 may be formed of a plastic material or a metal material, in addition to glass. When the substrate 1 is formed of metal, an insulating layer is on the substrate 1.

The reflective layer 54 on the substrate 1 may be silver (Ag), magnesium (Mg), aluminum (Al), platinum (Pt), palladium (Pd), gold (Au), nickel (Ni), neodymium (Nd), iridium (Ir), and/or chromium (Cr). The first electrode layer 51 may be on the reflective layer 54, and may be formed of an oxide having a high work function, such as ITO, IZO, ZnO, and/or $In_2O_3$. In this case, the first electrode layer 51 functions as an anode. If the first electrode layer 51 functions as a cathode, the first electrode layer 51 is formed of a material selected from the group consisting of Ag, Mg, Al, Pt, Pd, Au, Ni, Nd, Ir, Cr and combinations thereof so as to also perform a function of the reflective layer 54. Hereinafter, a case where the first electrode layer 51 functions as an anode will be described in more detail.

The second electrode layer 53 may be formed as a transparent electrode. In addition, when the second electrode layer 53 is formed as a semi-transparent layer, the second electrode layer 53 may be formed of a metal having a low work function, for example, a material selected from the group consisting of lithium (Li) calcium (Ca), LiF/Ca, LiF/Al, Al, Mg, Ag, and combinations thereof, and may be formed to be thin. Also, issues associated with an increased resistance due to a small thickness may be addressed by forming a transparent conductor, such as ITO, IZO, ZnO, and/or $In_2O_3$, on the semi-transparent layer.

The emissive layer 52 interposed between the first electrode layer 51 and the second electrode layer 53 is the same as in the above-described embodiments.

According to the present embodiment, the phase retardation layer 3 and the linear polarization layer 2 are sequentially arranged in the stated order on the second electrode layer 53.

Thus, external light from a direction in which an image is realized, that is, external light from above the top-emission type organic light-emitting display apparatus of FIG. 5 is sequentially transmitted through the linear polarization layer 2 and the phase retardation layer 3, and then is reflected on each layer of the organic light-emitting device 5 or the reflective layer 54. In this case, the external light may not be transmitted through the linear polarization layer 2 and the phase retardation layer 3. This principle is the same as in the above-described embodiments, and thus a detailed description thereof will not be provided again.

Figure 6:
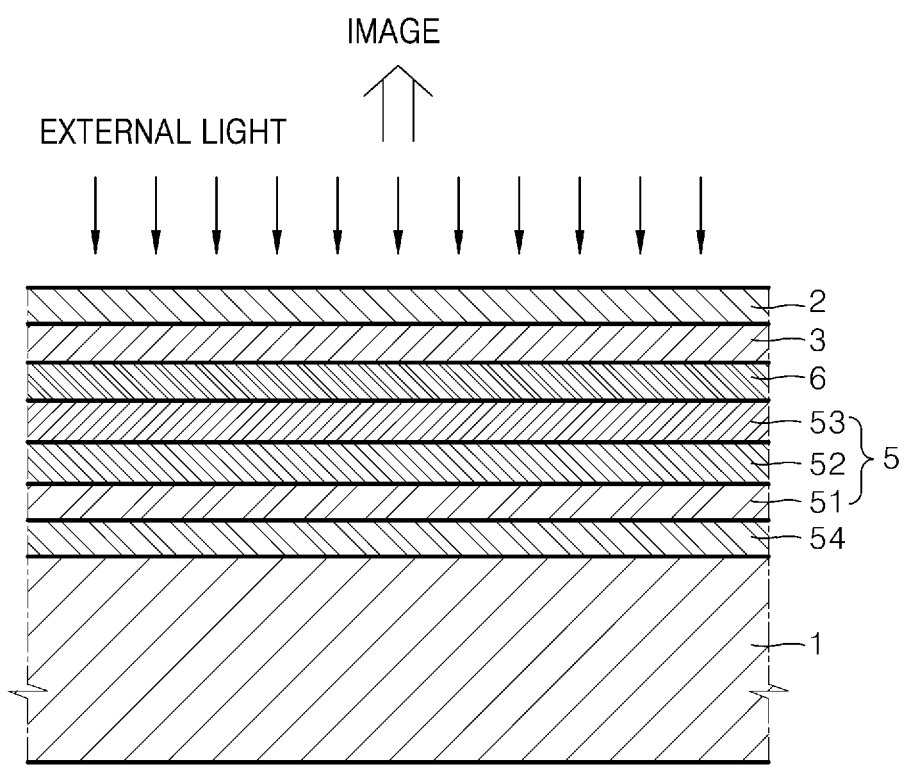

A protective layer 6 may be on the second electrode layer 53, and then the phase retardation layer 3 and the linear polarization layer 2 may be on the protective layer 6, as shown in FIG. 6.

The protective layer 6 may prevent or protect the second electrode layer 53 from being damaged during sputtering for forming the phase retardation layer 3, and may be formed of a transparent inorganic or organic material.

The inorganic material may be a metal oxide, a metal nitride, a metal carbide, and/or a metal oxynitride. The metal oxide may be a silicon oxide, an aluminium oxide, a titanium oxide, an indium oxide, a tin oxide, and/or an indium tin oxide. The metal nitride may be an aluminium nitride, and/or a silicon nitride. The metal carbide may be a silicon carbide, and the metal oxynitride may be a silicon oxynitride. The inorganic material may be silicon, and may be a ceramic derivative of silicon and/or metal. In addition, the inorganic material may be diamond-like carbon (DLC), or the like.

The organic material may be an organic polymer, an inorganic polymer, an organometallic polymer, and/or a hybrid organic/inorganic polymer, and/or may be an acryl resin.

Although not illustrated, the protective layer 6 may be between the phase retardation layer 3 and the linear polarization layer 2, or alternatively, may be on the linear polarization layer 2.

Figure 7:
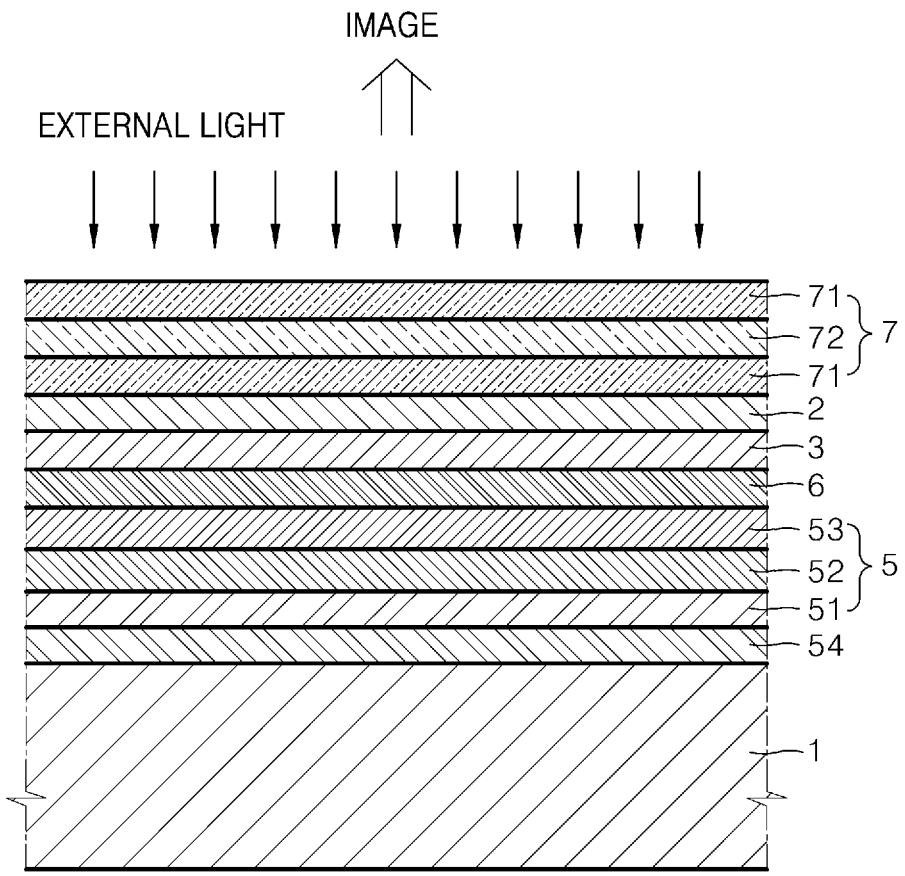

FIG. 7 is a cross-sectional view of a top-emission type organic light-emitting display apparatus according to another embodiment of the present invention. The top-emission type organic light-emitting display apparatus of FIG. 7 is manufactured by further forming a film-type sealing member 7 on the linear polarization layer 2 of the top-emission type organic light-emitting display apparatus of FIG. 6.

The film-type sealing member 7 protects the organic light-emitting device 5 from external moisture and oxygen. The film-type sealing member 7 includes an inorganic layer 71 and/or an organic layer 72, and may be formed by alternately stacking the inorganic layer 71 and the organic layer 72. The remaining configuration is the same as in the above-described embodiments, and a detailed description thereof will not be provided again.

The inorganic layer 71 may be formed of a metal oxide, a metal nitride, a metal carbide, and/or a metal oxynitride. The metal oxide may be a silicon oxide, an aluminium oxide, a titanium oxide, an indium oxide, a tin oxide, and/or an indium tin oxide. The metal nitride may be an aluminium nitride and/or a silicon nitride. The metal carbide may be a silicon carbide, and the metal oxynitride may be a silicon oxynitride. Silicon may be used as an inorganic material, and a ceramic derivative of silicon and/or metal may be used. In addition, DLC may be used.

The inorganic layer 71 may be formed by using a suitable deposition method. In this case, an air void containing the inorganic layer 71 may be grown. Thus, to prevent or limit the air void from being grown at the same location, the organic layer 72 may be further formed in addition to the inorganic layer 71. The organic layer 72 may be an organic polymer, an inorganic polymer, an organometallic polymer, and/or a hybrid organic/inorganic polymer, and/or may be an acryl resin.

In FIG. 7, the inorganic layer 71, the organic layer 72, and the inorganic layer 71 are sequentially stacked in the stated order on the linear polarization layer 2, but embodiments of the present invention are not limited thereto. For example, the organic layer 72, the inorganic layer 71, and the organic layer 72 may be sequentially stacked, or a plurality of layers of the organic layer 72, the inorganic layer 71, and the organic layer 72 may be stacked. The film-type sealing member 7 may be applied not only to FIG. 7, but also to other embodiments of the present invention.

Figure 8:
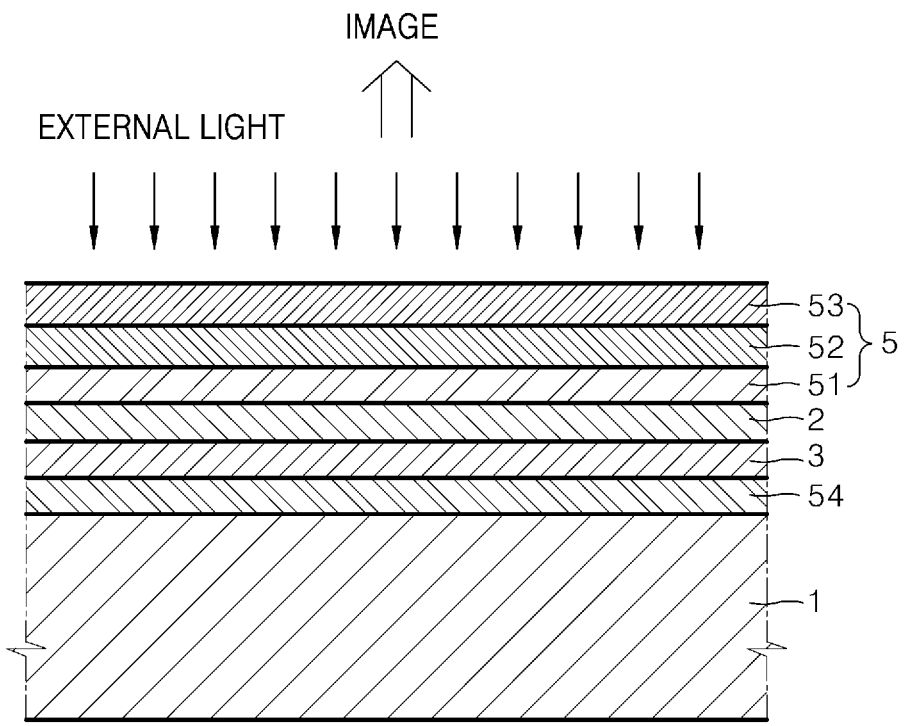

FIG. 8 is a cross-sectional view of a top-emission type organic light-emitting display apparatus according to another embodiment of the present invention. In FIG. 8, the phase retardation layer 3 and the linear polarization layer 2 are between the reflective layer 54 and the organic light-emitting device 5. External light from a direction indicated by the smaller arrows is converted into linearly polarized light that is polarized in a direction parallel to a transmission-axis direction while transmitting through the linear polarization layer 2, and is converted into circularly polarized light that rotates in one direction while transmitting through the phase retardation layer 3. Then, after the external light is reflected by the reflective layer 54, the external light is converted into circularly polarized light that rotates in an opposite direction. The circularly polarized light that rotates in the opposite direction is converted into linearly polarized light that is polarized in a direction perpendicular to a transmission-axis direction while transmitting through the phase retardation layer 3. The linearly polarized light is not transmitted through the linear polarization layer 2, and thus reflected external light may not be viewed above the upper portion of the substrate 1.

Alternatively, although not illustrated, the phase retardation layer 3 may be formed on the reflective layer 54, the organic light-emitting device 5 may be formed on the phase retardation layer 3, and then the linear polarization layer 2 may be formed on the organic light-emitting device 5.

Figure 9:
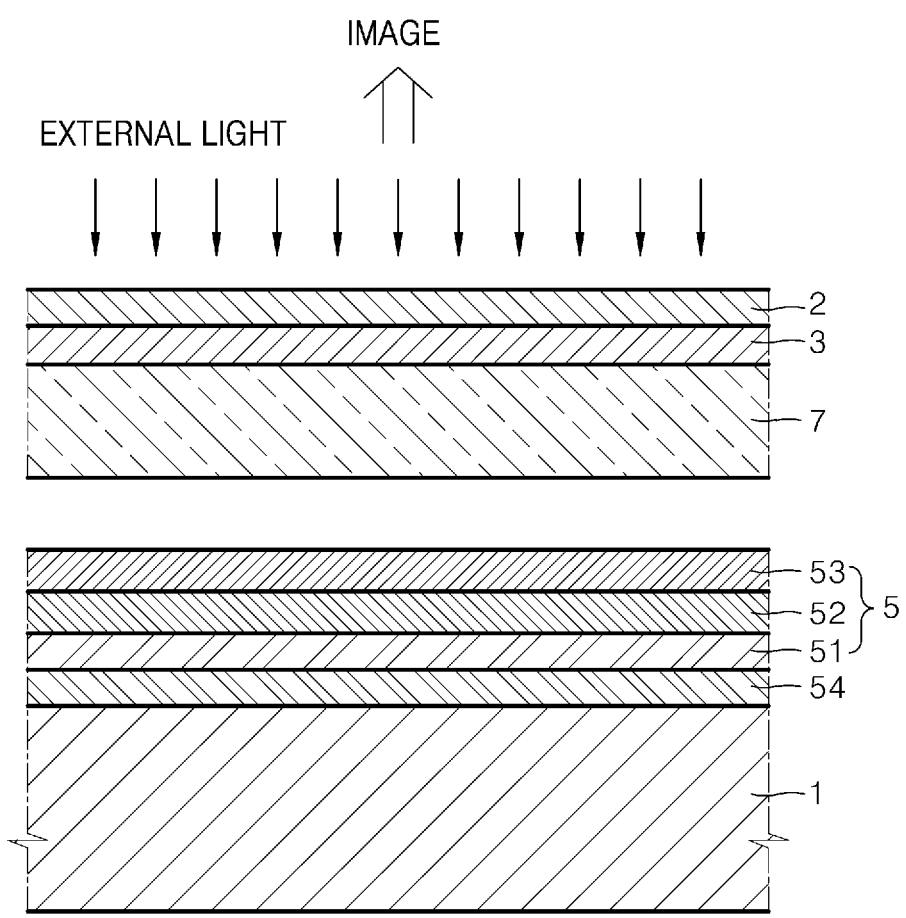

FIG. 9 is a cross-sectional view of a top-emission type organic light-emitting display apparatus according to another embodiment of the present invention, and illustrates a case where a transparent substrate is used as the sealing member 7.

The transparent substrate may be a glass substrate, but is not limited thereto. For example, the transparent substrate may be a plastic substrate.

According to the present embodiment, the phase retardation layer 3 and the linear polarization layer 2 are sequentially arranged in the stated order on an upper surface of the sealing member 7, that is, a surface of the sealing member 7, which faces outwards.

Figure 10:
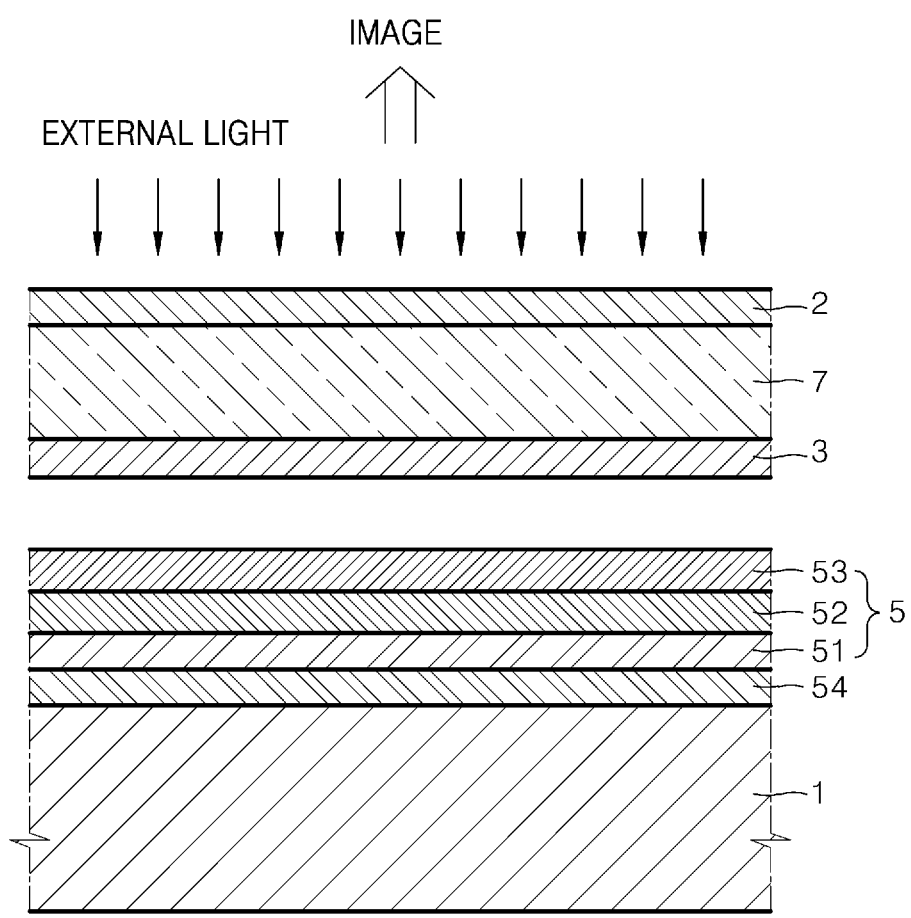

FIG. 10 is a cross-sectional view of a top-emission type organic light-emitting display apparatus according to another embodiment of the present invention. In FIG. 10, the phase retardation layer 3 is on one surface of the transparent substrate as the sealing member 7, which faces the organic light-emitting device 5. In addition, the linear polarization layer 2 is on an opposite surface of the sealing member 7.

Figure 11:
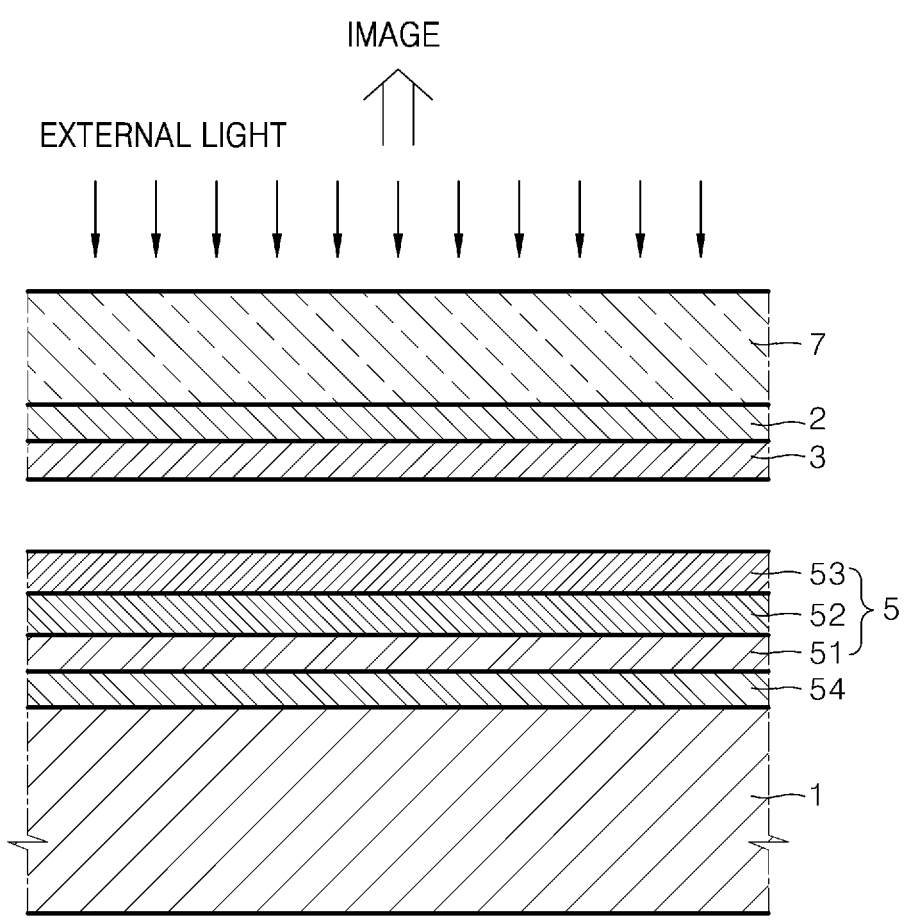

FIG. 11 is a cross-sectional view of a top-emission type organic light-emitting display apparatus according to another embodiment of the present invention. In FIG. 11, the linear polarization layer 2 and the phase retardation layer 3 are sequentially arranged in the stated order on a surface of the transparent substrate as the sealing member 7, which faces the organic light-emitting device 5.

Also, in the top-emission type organic light-emitting display apparatuses of FIGS. 5 through 11, the linear polarization layer 2 is located to be close to an external light source, compared to the phase retardation layer 3, and the phase retardation layer 3 is below the linear polarization layer 2, thereby preventing or reducing external light from being reflected according to the above-described principle.

In the top-emission type organic light-emitting display apparatuses of FIGS. 9 through 11, although not illustrated, inert gas may be filled between the sealing member 7 and the organic light-emitting device 5, and an organic or inorganic material may be therebetween, thereby further improving the sealing characteristics of the organic light-emitting device 5.

Figure 12:
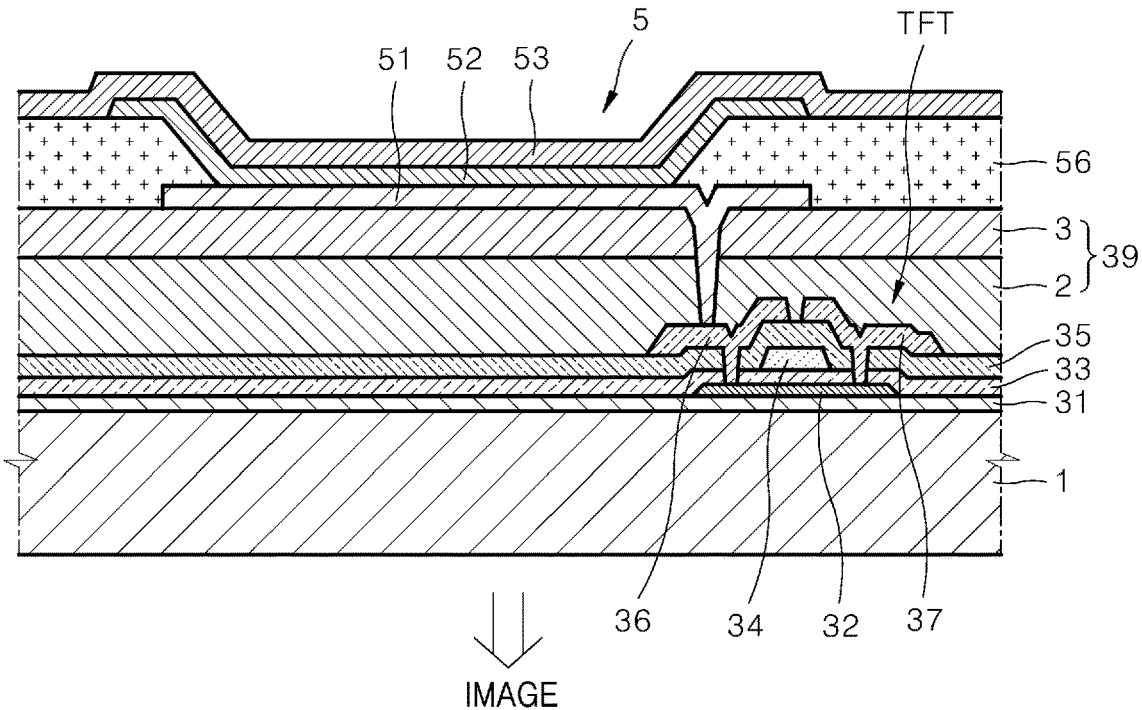
FIGS. 12 and 13 are cross-sectional views of bottom-emission type organic light-emitting display apparatuses of an active matrix (AM) type, according to embodiments of the present invention.

FIG. 12 is a cross-sectional view of a bottom-emission type organic light-emitting display apparatus of an active matrix (AM) type, according to another embodiment of the present invention.

Referring to FIG. 12, a thin film transistor (TFT) is on the substrate 1. At least one TFT is on every pixel, and is electrically connected to the organic light-emitting device 5.

In more detail, a buffer layer 31 is on the substrate 1, and a semiconductor active layer 32 having a preselected or predetermined pattern is on the buffer layer 31. A gate insulating layer 33 formed of $SiO_2$ or $SiN_x$ is on the semiconductor active layer 32, and a gate electrode 34 is on a preselected or predetermined region of the gate insulating layer 33. The gate electrode 34 is connected to a gate line for applying a TFT on/off signal. An interlayer insulating layer 35 is on the gate electrode 34. Source/drain electrodes 37 and 36 are formed so as to contact source/drain regions of the semiconductor active layer 32 through contact holes, respectively.

The TFT formed as described above is covered and protected by a passivation layer 21. In FIG. 12, the passivation layer 39 is formed by sequentially stacking the linear polarization layer 2 and the phase retardation layer 3.

The first electrode layer 51, which functions as an anode, is on the phase retardation layer 3, and a pixel define layer 56 is formed so as to cover the first electrode layer 51. An opening is formed in the pixel define layer 56, and the emissive layer 52 is formed in a region defined by the opening. Then, the second electrode layer 53 is formed so as to cover all the pixels.

Also in the bottom-emission type organic light-emitting display apparatus of an AM type, since the linear polarization layer 2 and the phase retardation layer 3 are sequentially stacked in the stated order on the TFT, the linear polarization layer 2 and the phase retardation layer 3 may prevent or reduce external light from below the bottom-emission type organic light-emitting display apparatus from being reflected.

Figure 13:
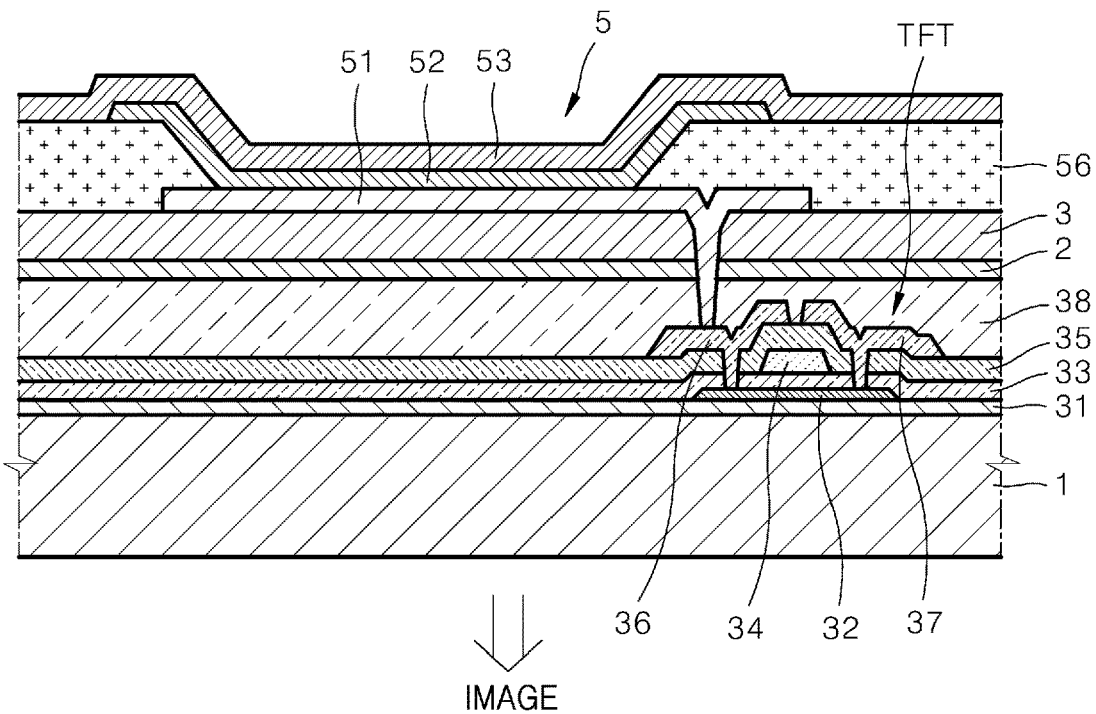

As shown in FIG. 13, a passivation layer 38 formed of an organic material and/or an inorganic material may be on the TFT, and the linear polarization layer 2 and the phase retardation layer 3 may be sequentially arranged in the stated order on the passivation layer 38.

In the bottom-emission type organic light-emitting display apparatus of an AM type, as long as the linear polarization layer 2 is located so as to be relatively close to an external light source, and the phase retardation layer 3 is located so as to be relatively close to the organic light-emitting device 5, the linear polarization layer 2 and the phase retardation layer 3 may be on any surfaces of the substrate 1, the TFT, and/or the organic light-emitting device 5. That is, although not illustrated, the phase retardation layer 3 and the linear polarization layer 2 are on one side and/or the other side of the substrate, as shown in FIGS. 1, 3 and 4, and then the TFT and the organic light-emitting device 5 may be on the phase retardation layer 3 and the linear polarization layer 2, or alternatively, the phase retardation layer 3 and/or the linear polarization layer 2 may be between layers constituting the TFT.

Figure 14:
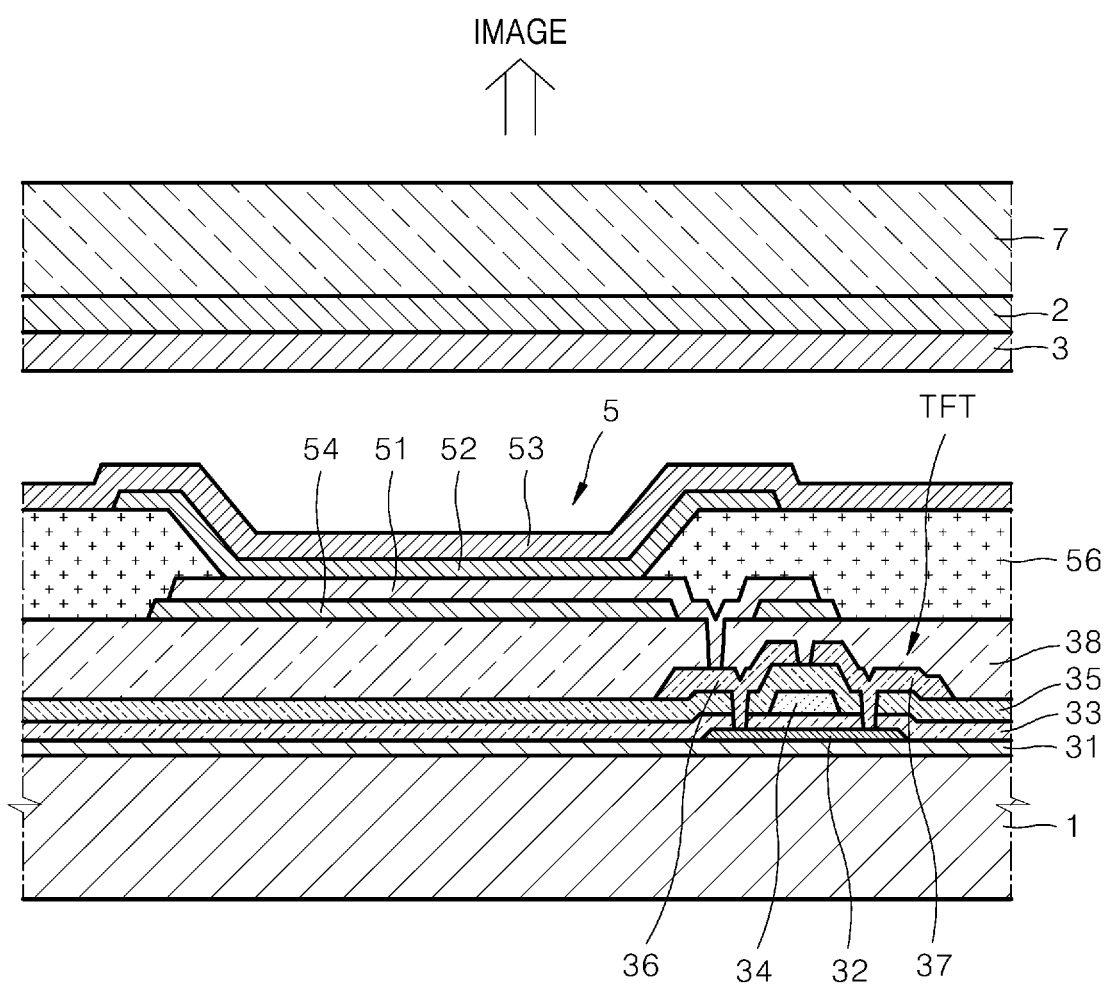
FIG. 14 is a cross-sectional view of a top-emission type organic light-emitting display apparatus of an AM type, according to another embodiment of the present invention.

FIG. 14 is a cross-sectional view of a top-emission type organic light-emitting display apparatus of an AM type, according to another embodiment of the present invention.

Referring to FIG. 14, the TFT is on the substrate 1. At least one TFT is on every pixel, and is electrically connected to the organic light-emitting device 5. The structure of the TFT is the same as in FIG. 12, and thus a detailed description thereof will not be provided again.

As shown in FIG. 14, a passivation layer 38 is formed so as to cover the TFT, and the reflective layer 54 is on the passivation layer 38. The first electrode layer 51, functioning as an anode, is on the reflective layer 54, and the pixel define layer 56, which is formed of an insulating material, is formed so as to cover the first electrode layer 51. An opening is formed in the pixel define layer 56, and the emissive layer 52 is formed in a region defined by the opening. Then, the second electrode layer 53 is formed so as to cover all the pixels.

In FIG. 14, the linear polarization layer 2 and the phase retardation layer 3 are sequentially arranged in the stated order on a surface of a substrate as the sealing member 7, which faces the organic light-emitting device 5, like in FIG. 11. Thus, the linear polarization layer 2 and the phase retardation layer 3 may prevent or reduce external light from above the top-emission type organic light-emitting display apparatus of FIG. 14 from being reflected.

Although not illustrated, the configurations of FIGS. 5 and 10 may also be applied to such AM type organic light-emitting display apparatuses.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light-emitting display apparatus comprising:
    a substrate;
    an organic light-emitting device on the substrate;
    a sealing member on the organic light-emitting device;
    a phase retardation layer on a surface of the organic light emitting device; and
    a linear polarization layer on a surface of the sealing member,
    wherein the linear polarization layer is located to be closer to a source of external light than the phase retardation layer, and
    wherein the linear polarization layer comprises a photochromic material.

2. The organic light-emitting display apparatus of claim 1, further comprising a protective layer on the organic light-emitting device,
    wherein the phase retardation layer is on the protective layer, and
    wherein the linear polarization layer is on the phase retardation layer.

3. The organic light-emitting display apparatus of claim 1, further comprising a protective layer on the organic light-emitting device,
    wherein the phase retardation layer is between the organic light-emitting device and the protective layer, and
    wherein the linear polarization layer is on the protective layer.

4. The organic light-emitting display apparatus of claim 1, further comprising a reflective layer interposed between the substrate and the organic light-emitting device.

* * * * *